United States Patent [19]

Hashimoto

[11] Patent Number: 5,465,407
[45] Date of Patent: Nov. 7, 1995

[54] GAIN CONTROLLER FOR A DIGITAL MOBILE RADIO RECEIVER

[75] Inventor: Kazuya Hashimoto, Tokyo, Japan

[73] Assignee: NEC Corporation, Japan

[21] Appl. No.: 23,332

[22] Filed: Feb. 26, 1993

[30] Foreign Application Priority Data

Feb. 29, 1992 [JP] Japan .................................. 4-079275

[51] Int. Cl.⁶ .................................................. H04B 1/06
[52] U.S. Cl. ...................... 455/234.2; 455/209; 330/129
[58] Field of Search ............................ 455/234.1, 234.2, 455/232.1, 208, 209, 214; 330/279, 129, 86, 282

[56] References Cited

U.S. PATENT DOCUMENTS 4,829,570  5/1989  Schotz ........................................ 381/3
4,859,964  8/1989  Jorgensen ................................ 330/279

Primary Examiner—Reinhard J. Eisenzopf
Assistant Examiner—Mary M. Lin
Attorney, Agent, or Firm—Ostrolenk, Faber, Gerb & Soffen

[57] ABSTRACT

A digital mobile radio receiver comprising a limiter amplifier, an orthogonal detector, a low pass filter, an A/D converter and a digital signal processing unit, additionally having a head amplifier able to vary a gain between said low pass filter and said A/D converter and a gain control unit controlling a gain of said head amplifier according to a command from said digital signal processing unit.

3 Claims, 3 Drawing Sheets

GAIN CONTROLLER FOR A DIGITAL MOBILE RADIO RECEIVER

BACKGROUND OF THE INVENTION

The present invention relates to a digital mobile radio receiver, especially a receiver using a limiter amplifier.

A receiving unit of a conventional digital mobile receiver, as shown in FIG. 6, comprises an intermediate frequency filter 1 to restrict the band, the a limiter amplifier 2 to amplify and restrict an amplitude for the output of the intermediate frequency filter 1, an orthogonal detector 3 orthogonally detecting and outputting I and Q components, low pass filters 4 and 5 removing useless waves from the I and Q components, A/D converters 6 and 7 each converting an output of the low pass filters to a digital value, and a digital signal processing unit 8 regenerating a received signal.

In the above-mentioned circuit the intermediate frequency filter 1 restricts the band of the input frequency signal $IF_0$ and provides a signal $IF_1$ as the output of the intermediate frequency filter 1. Next the limiter amplifier 2 amplifies the output $IF_1$ and restricts the amplitude thereof, and provides a signal $IF_2$ as the output of the limiter amplifier 2. Then the orthogonal detector 3 orthogonally detects the output $IF_2$ and outputs $I_0$ as the I component and $Q_0$ as the Q component. Continuously these outputs $I_0$ and $Q_0$ are filtered into the outputs $I_1$ and $Q_1$ of the low pass filters 4 and 5 after useless waves thereof are respectively removed by the low pass filters 4 and 5. The the A/D converters 6 and 7 convert these outputs $I_1$ and $Q_1$ to digital values from the analog values and provide the outputs $I_2$ and $Q_2$ as the outputs of the respective A/D converters, and the outputs $I_2$ and $Q_2$ are subjected to digital signal processing by the digital signal processing unit 8 to be regenerated In this circuit, however, if an interfering wave is present in the output $IF_1$ of the intermediate frequency filter, the limiter amplifier 2 is saturated and the of the amplitudes is restricted by the bigger amplitude of the interfering wave and the desired wave, so that the output $IF_2$ of the limiter amplifier is always kept at a fixed amplitude.

Consequently, if the amplitude of the interfering wave is bigger than that of the desired one, the limiter amplifier 2 is saturated by the interfering wave and outputs $IF_2$ without amplifying sufficiently the amplitude of the desired wave. And when the output $IF_2$ of the limiter amplifier 2 is inputted to the detector 3 in this state, if the detector 3 is of a linear type, the desired wave component of the outputs $I_0$ and $Q_0$ of the detector 3 becomes more deteriorated for the insertion loss.

As a result, there has been a problem that if the interfering wave component is removed from the outputs $I_0$ and $Q_0$ of the detector 3 by the low pass filters 4 and 5, the input level of the outputs $I_1$ and $Q_1$ of the low pass filters 4 and 5, of which the desired wave components are inputted to the A/D converters 6 and 7, absolutely degrades. Accordingly, the effective resolution of the received wave decreases, and a degradation of the receiving characteristic of the receiver occurs.

SUMMARY OF THE INVENTION

The object of this invention is to provide a digital mobile radio receiver with reduced a deterioration of its receiving characteristic.

The object is accomplished by a digital mobile radio receiver comprising a limiter amplifier amplifying an intermediate frequency signal, an orthogonal detector orthogonally detecting an output of the limiter amplifier to output I and Q components, a low pass filter removing useless waves from said I and Q components, an A/D converter converting an output of the low pass filter to a digital value, and a digital signal processing unit receiving an output of the A/D converter, a head amplifier able to vary a gain installed between said low pass filter and said A/D converter, and a gain control unit controlling a gain of said head amplifier according to a command from said digital signal processing unit.

In particular, the digital mobile radio receiver comprised as above has a head amplifier able to vary a gain installed between a low pass filter and an A/D converter, and by controlling the gain of this head amplifier according to the command from the digital signal processing unit, the input level of the A/D converter can be always made steady, and the deterioration of the effective resolution of the receiving can be improved.

Moreover, it is preferable in the digital mobile radio receiver that the circuit comprised of the head amplifier able to vary a gain and the gain control unit comprise an operational amplifier and a variable resistor.

Furthermore, it is preferable in the digital mobile radio receiver that the digital signal processing unit comprise a digital signal processor storing in a memory a program to estimate a maximum value of an input to an A/D converter based on an output level of the A/D converter, decide whether the input level to the A/D converter is adequate or not based on the maximum value of the input, and provide a gain control unit with adequate gain information according to the decision information.

DESCRIPTION OF THE PREFERRED EMBODIMENT

Figure 1:
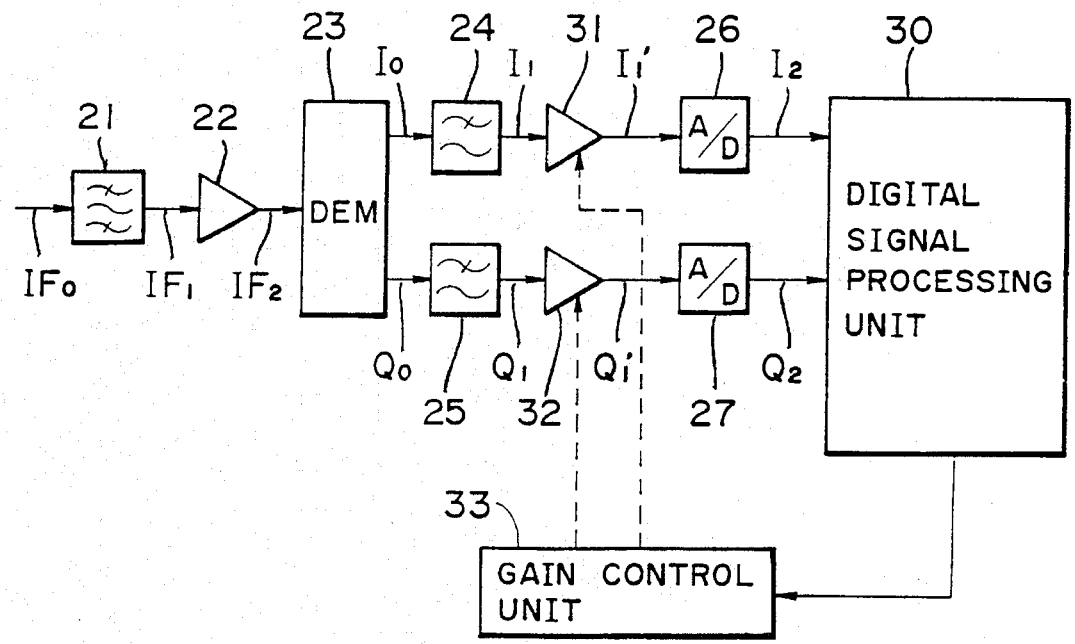
FIG. 1 is a block diagram with necessary parts of an embodiment of the digital mobile radio receiver of the present invention.
Figure 2:
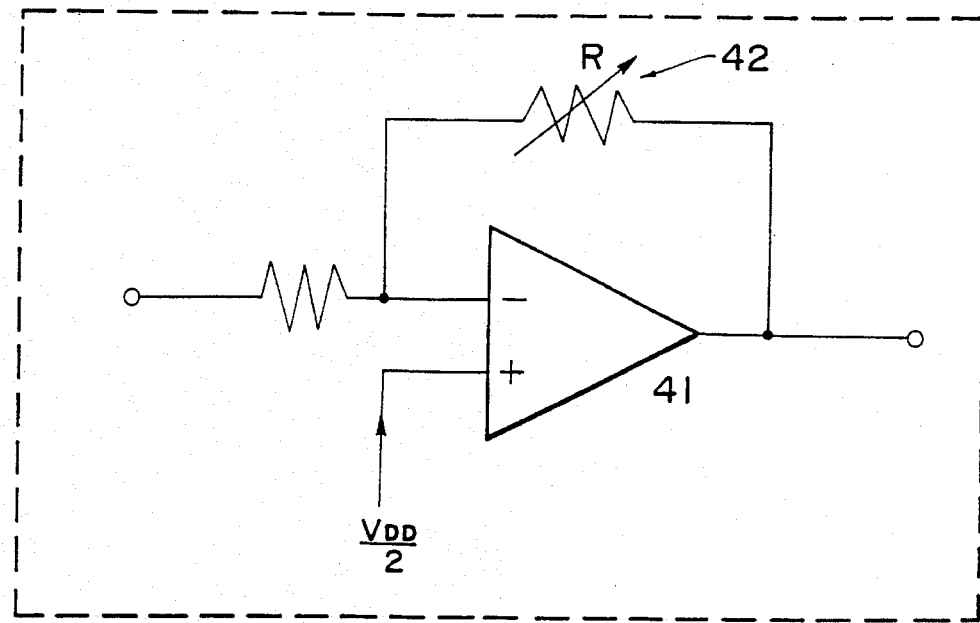
FIG. 2 is a circuit diagram showing a circuit comprising a head amplifier able to vary a gain and a gain control unit.
Figure 3A:
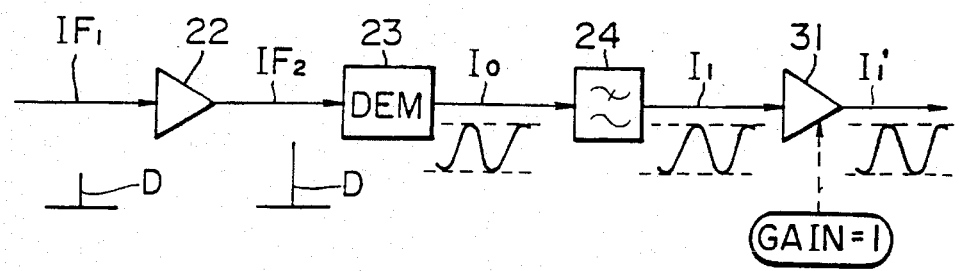
FIGS. 3A and 3B are figures is a figure to describe an operation of the embodiment in FIG. 1.
Figure 3B:
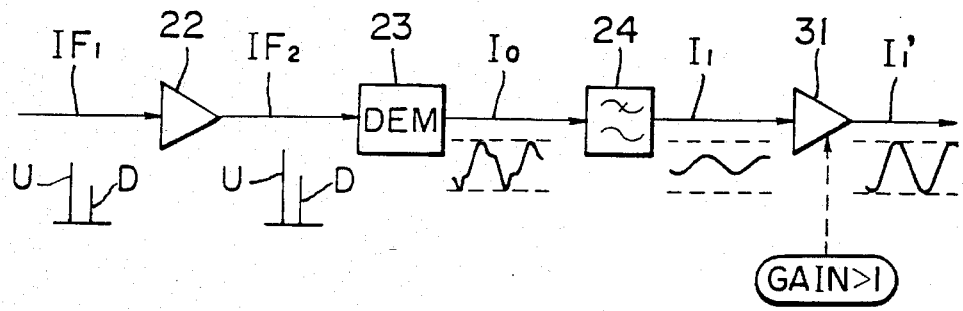
Figure 4:
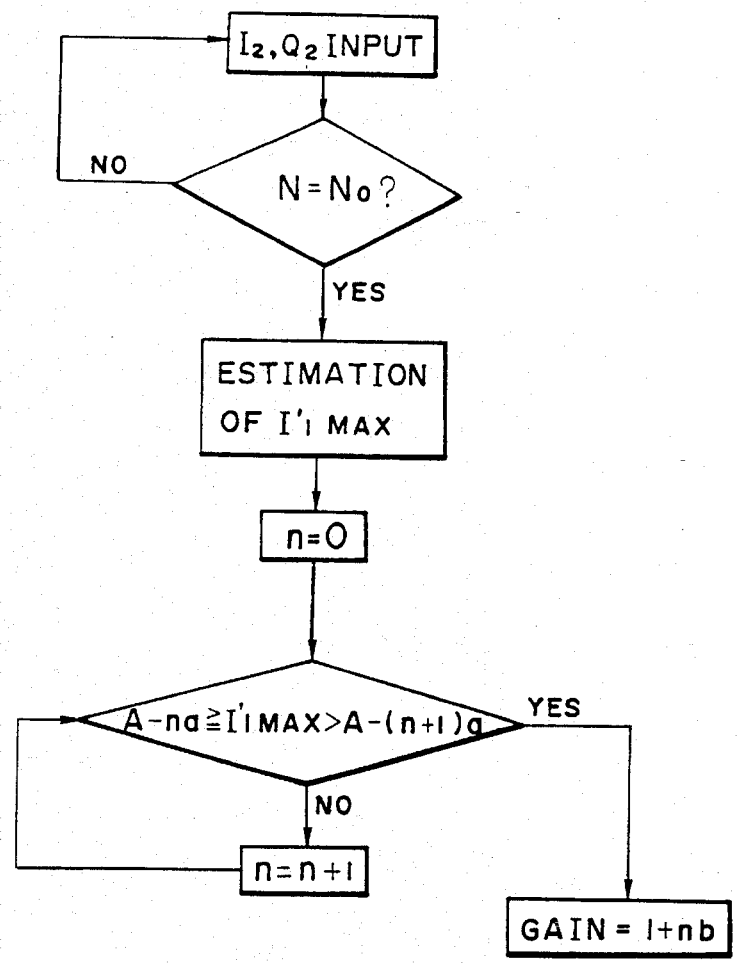
FIG. 4 is a flowchart diagram showing an operation of the digital signal processing unit in FIG. 1.
Figure 5:
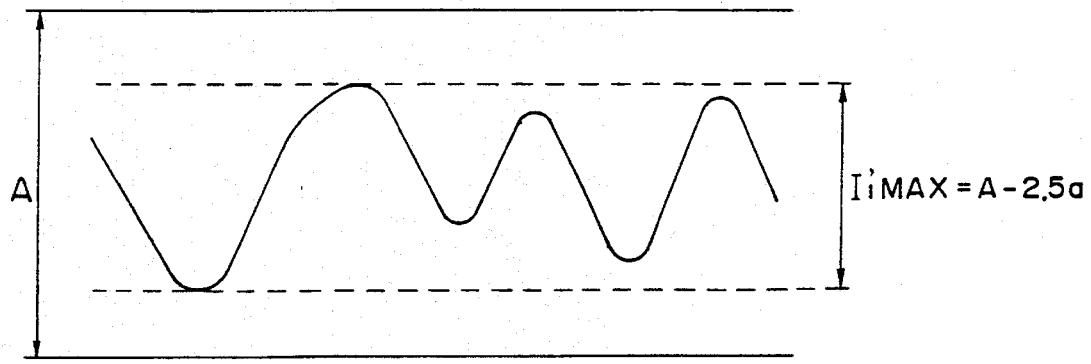
FIG. 5 is a figure showing an example of a maximum value of an input level into an A/D converter.

FIGS. 1 to 5 show an embodiment of a digital mobile radio receiver by the present invention. FIG. 1 shows a block diagram with necessary parts of an embodiment of a digital mobile radio receiver of the present invention, FIG. 2 shows a circuit diagram showing a circuit comprising a head amplifier able to vary a gain and a gain control unit, FIGS. 3A and 3B are diagrams to definitely describe an operation of the embodiment in FIG. 1, FIG. 4 is a flowchart showing an operation of a digital signal processing unit, and FIG. 5 is a figure showing an example of a maximum value of an input level to an A/D converter.

Figure 6:
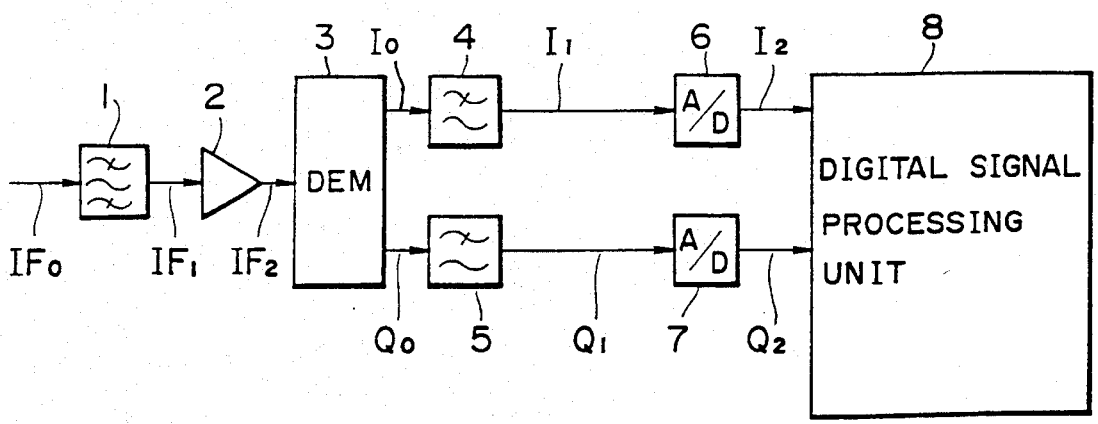
FIG. 6 is a block diagram with necessary parts of a conventional digital mobile radio receiver.

In each of the figures, 21 is an intermediate frequency filter, 22 is a limiter amplifier, 23 is an orthogonal detector, 24 and 25 are low pass filters, and 26 and 27 are A/D converters. The components of these parts are the same the conventional one as described in FIG. 6, so that the detailed description is omitted.

30 is a digital signal processing unit, 31 and 32 are head amplifiers, and 33 is a gain control unit.

The characteristic of this embodiment is that the head amplifier 31 able to vary a gain is installed between the low pass filter 24 and the A/D converter 26, and also the head amplifier 32 able to vary a gain is installed between the low pass filter 25 and the A/D converter 27, respectively. The digital signal processing unit 30 commanding the gain control unit 33 with the gain information of the head amplifiers 31 and 32 and the gain control unit 33 controlling the gain of the head amplifiers 31 and 32 according to the command from the digital signal processing unit 30 are provided as shown.

As shown in FIG. 2, the circuit A comprising the head amplifiers 31 and 32 and the gain control unit 33 is comprised of the operational amplifier 41 and the variable resistor 42, and is able to restrict a gain of the operational amplifier by the variable resistor 42.

Moreover, the digital signal processing unit 30 is comprised of a digital signal processor having in a memory a program to estimate a maximum value of the input to the A/D converters 26 and 27 based on the output level of the A/D converters 26 and 27, decide whether the input level to the A/D converters 26 and 27 is adequate or not based on the maximum value of the input, and provide the gain control unit 33 with the adequate gain information according to the decision information. The digital signal processor has excellent high speed performance, and the advantage to be able to easily change the count number and so on of the digital signal processing unit 30 by modifying the program as described below.

The outputs $I_2$ and $Q_2$ of the A/D converters 26 and 27 are respectively read by the digital signal processing unit 30. The digital signal processing unit 30 estimates a maximum value of the input to the A/D converter by the outputs $I_2$ and $Q_2$ of the A/D converters 26 and 27, and decides, based on the maximum value of the input, whether the level of the inputs $I_1'$ and $Q_1'$ to the A/D converters 26 and 27 are adequate or not. If the level is not adequate the digital signal processing unit 30 provides the gain control unit with adequate information about the gain.

Next, the gain control unit 33 controls the gain of the head amplifiers 31 and 32 based on the command from the digital signal processing unit 30. The outputs $I_1$ and $Q_1$ of the low pass filters 24 and 25 are inputted to the head amplifiers 31 and 32, amplified at an adequate level, and outputted as the outputs $I_1'$ and $Q_1'$, so that the level of the inputs $I_1'$ and $Q_1'$ to the A/D converters 26 and 27 are always adequate.

The operation of the embodiment is described as follows.

FIG. 3A shows the case where the output $IF_1$ of the intermediate frequency filter is input with only the desired wave to the limiter amplifier 22, and FIG. 3B shows another case where the output $IF_1$ of the intermediate frequency filter with the interfering wave, of which the amplitude is larger than the desired wave, to the limiter amplifier 22. Now in FIGS. 3A and 3B, only the I component is shown after orthogonal detection, and D shows the desired wave spectrum and U shows the interfering wave spectrum, respectively.

For FIG. 3A only the desired wave exists in the output $IF_1$ of the intermediate frequency filter, so that the limiter amplifier 22 is saturated by the desired wave. Therefore the output $IF_2$ of the limiter amplifier 22 is outputted with the state that the desired wave is amplified up to the amplitude restriction. After that the output $IF_2$ of the limiter amplifier 22 is inputted to the orthogonal detector 23 and is provided as the output $I_0$ of the orthogonal detector 23, and further the output $I_0$ of the orthogonal detector 23 is inputted to the low pass filter 24 and is provided as the output $I_1$ of the low pass filter 24.

Then the interfering wave component is not involved in the output $I_0$ of the orthogonal detector 23, so that the output $I_1$ has the same wave form as the output $I_0$ of the orthogonal detector 23, and also receives the amplitude attenuation only for the insertion loss of the low pass filter 24.

Accordingly the output $I_1$ of the low pass filter 24 is an ideal signal and also not necessarily amplified by the head amplifier 31, so that this state is made as a standard and the gain of the head amplifier 31 is made 1.

On the other hand, as shown in FIG. 3B, if the output $IF_1$ of the intermediate frequency filter containing an interfering wave having an amplitude larger than the desired wave is input to the filter 22, the limiter filter 22 is saturated by the interfering wave. Therefore the output $IF_2$ of the limiter amplifier 22 is outputted without having amplified sufficiently the desired wave. The desired wave spectrum D and interfering wave spectrum U in the output $IF_2$ of the limiter amplifier in FIG. 3B show this state (one in which the desired wave is unable to amplified sufficiently).

Then the output $IF_2$ of the limiter amplifier 22 is inputted to the orthogonal detector 23 with this state and is provided as the output $I_0$ of the orthogonal detector 23, the interfering wave component is removed by the low pass filter 24, and the output $I_1$ of the low pass filter 24 with only the desired wave component is obtained.

However, in the case of FIG. 3B, as the limiter amplifier 22 can not amplify sufficiently the amplitude of the desired wave, the level of the output $I_1$ of the low pass filter 24 is more attenuated than the insertion loss of the low pass filter 24 compared with the level of the output $I_0$ of the orthogonal detector 23. Therefore the amplitude of the output $I_1$ of the low pass filter 24 is smaller compared with the case of FIG. 3A.

Then, in the present invention, the gain of the head amplifier 31 is made greater than 1 by the command of the gain control unit 33, and the output $I_1'$ amplifying the amplitude of the output $I_1$ of the low pass filter 24 is outputted from the head amplifier.

Next, an operation of the digital signal processing unit is described, from the estimation of the input $I_1'$ level to the A/D converter 26 to the setting of the gain of the head amplifier 31.

Hereupon, in FIG. 4, N is a variable counting the number of data reading the outputs $I_2$ and $Q_2$ of the A/D converter inputted to the digital signal processing unit 30, $N_0$ is a number of the reading data that has been predetermined, n is an integer, A is the input range of the A/D converter, and a and b are real numbers.

First of all, the digital signal processing unit 30 reads the outputs $I_2$ and $Q_2$ of the A/D converters 26 and 27, calculates $I_1^2+Q_2^2$ based on the outputs $I_2$ and $Q_2$ of the A/D converters 26 and 27, and stores the result in the memory. This operation is repeated $N_0$ times.

Then the maximum value X of $I_1^2+Q_2^2$ is calculated from the result stored in the memory, and also $\sqrt{X}$ is calculated, and this value $\sqrt{X}$ is to be $I_1'_{MAX}$.

Next, the digital signal processing unit 30 starts counting from n=0 until the value of $I_1'_{MAX}$ reaches the range of $A-na \geq I_1'_{MAX} > A-(n+1)a$.

Then it determines n such that $I_1'_{MAX}$ is in said range and gives the indication to the gain control unit based on this n, so that the gain of the head amplifier becomes 1+nb.

As shown in FIG. 5, for example, assuming that $I_1'_{MAX}$ is A−2.5a (a is a proper real number), the digital signal processing unit 10 starts counting from n=0 until $I_1'_{MAX}$ reaches the range $A-na \geq I_1'_{MAX} > A-(n+1)a$.

In this case, when n=2, the expression $A-2a \geq I_1'_{MAX}$ (A−2.5a)>A−3a is met. Therefore the digital signal processing unit 30 sends the information to the gain control unit 33 so that the gain of the head amplifier 26 becomes 1+2b. Here b is the constant approximated by $A/A-2a \approx 1+2a/a=1+2b$.

Thus, in the present invention, a head amplifier able to vary a gain is installed between a low pass filter and an A/D converter. Furthermore, by installing a gain control unit to control a gain of the head amplifier according to a command from a digital signal control unit, an input level of the A/D converter can be kept steady.

Accordingly, by the present invention, even if a limiter amplifier is saturated by an interfering wave the received signal can be detected and regenerated with the same resolution as in the case without any interfering waves.

What is claimed is:

1. A digital mobile radio receiver comprising:

a limiter amplifier for amplifying an intermediate frequency signal;

an orthogonal detector for orthogonally detecting an output of said limiter amplifier and outputting an I component and a Q component;

a first low pass filter for removing undesired waves from said I component and outputting an $I_1$ component;

a second low pass filter for removing undesired waves from said Q component and outputting a $Q_1$ component;

a first head amplifier for amplifying said $I_1$ component at a level of gain that is set by a control signal;

a second head amplifier for amplifying said $Q_1$ component at a level of gain that is set at the same level as that of the gain of said first head amplifier by said control signal;

a first analog-to-digital converter for converting said $I_1$ component amplified by said first head amplifier to a digital value;

a second analog-to-digital converter for converting said $Q_1$ component amplified by said second head amplifier to a digital value;

a digital signal processing unit for estimating both an input level of said first analog-to-digital converter and an input level of said second analog to digital converter based on both an output level of said first analog-to-digital converter and an output level of said second analog-to-digital converter, calculating a proper input level based on the estimated input level, and outputting gain information; and a gain control unit for outputting said control signal to control both gains of said first head amplifier and said second head amplifier based on said gain information.

2. The digital mobile radio receiver of claim 1, wherein said digital signal processing unit comprises means for:

estimating a maximum value of input to an analog-to-digital converter based on an output level of said analog-to-digital converter;

judging whether an input level to said analog-to-digital converter is proper based-on said maximum value of input; and providing gain information to said gain control unit based on judging whether said input level is proper to change the input level to a proper level.

3. A digital mobile radio receiver comprising:

a limiter amplifier for amplifying an intermediate frequency signal;

an orthogonal detector for orthogonally detecting an output of said limiter amplifier and outputting an I component and a Q component;

a first low pass filter for removing undesired waves from said I component and outputting an $I_1$ component;

a second low pass filter for removing undesired waves from said Q component and outputting a $Q_1$ component;

a first head amplifier for amplifying said $I_1$ component at a level of gain that is set by a control signal;

a second head amplifier for amplifying said $Q_1$ component at a level of gain that is set at the same level as that of the gain of said first head amplifier by said control signal;

a first analog-to-digital converter for converting said $I_1$ component amplified by said first head amplifier to a digital value and outputting an $I_2$ signal;

a second analog-to-digital converter for converting said $Q_1$ component amplified by said second head amplifier to a digital value and outputting a $Q_2$ signal;

a memory means for receiving both N said $I_2$ signals and N said $Q_2$ signals, where N is a variable counting the number of said $I_2$ and $Q_2$ signals each, calculating a signal $X=I_2^2+Q_2^2$ for each pair of $I_2$ signal and $Q_2$ signal, where X is the sum of the squares of the $I_2$ and $Q_2$ signals, and storing N said X signals;

a means for selecting a maximum X from among said N X signals and calculating $\sqrt{X}$ based on the maximum X;

a means for searching for a value n meeting the following equation by starting at n=0, $A-na \geq \sqrt{X} \geq A-(n+1)a$, where A and a are real numbers, and for calculating 1+nb, where b is a real number; and a gain control means for outputting said control signal so that both gains of said first head amplifier and said second amplifier become equal to 1+nb.

\* \* \* \* \*